(12) United States Patent
Takashima et al.

(10) Patent No.: US 8,482,053 B2
(45) Date of Patent: Jul. 9, 2013

(54) NONVOLATILE SEMICONDUCTOR MEMORY DEVICE WITH HIGH-K INSULATING FILM

(75) Inventors: Akira Takashima, Fuchu (JP); Masao Shingu, Kawasaki (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/204,412

(22) Filed: Aug. 5, 2011

(65) Prior Publication Data

US 2012/0025297 A1 Feb. 2, 2012

Related U.S. Application Data

(63) Continuation of application No. PCT/JP2010/051437, filed on Feb. 2, 2010.

(30) Foreign Application Priority Data

Feb. 6, 2009 (JP) .................................. 2009-026603

(51) Int. Cl.
*H01L 29/792* (2006.01)

(52) U.S. Cl.
USPC ............ 257/324; 257/E29.309; 257/E21.243; 438/216; 438/287

(58) Field of Classification Search
USPC ........... 257/324, E29.309, E21.423; 438/216, 438/287
See application file for complete search history.

(56) References Cited

U.S. PATENT DOCUMENTS

| | | |
|---|---|---|
| 7,821,059 B2 | 10/2010 | Shingu et al. |
| 2002/0047170 A1* | 4/2002 | Ota .............................. 257/410 |
| 2005/0122783 A1* | 6/2005 | Kim et al. ................. 365/185.29 |
| 2006/0038236 A1* | 2/2006 | Yamamoto ..................... 257/368 |
| 2006/0157754 A1* | 7/2006 | Jeon et al. ...................... 257/288 |
| 2008/0237688 A1* | 10/2008 | Yasuda .......................... 257/316 |
| 2009/0020802 A1* | 1/2009 | Ma et al. ........................ 257/316 |
| 2009/0057751 A1 | 3/2009 | Ariyoshi et al. |
| 2009/0134450 A1* | 5/2009 | Kim et al. ...................... 257/325 |
| 2009/0166710 A1 | 7/2009 | Shimizu et al. |
| 2009/0206393 A1 | 8/2009 | Ariyoshi et al. |
| 2010/0072535 A1 | 3/2010 | Takashima et al. |

FOREIGN PATENT DOCUMENTS

| | | |
|---|---|---|
| JP | 2002-134739 | 5/2002 |
| JP | 2003-68897 | 3/2003 |
| JP | 2005-217409 | 8/2005 |

(Continued)

OTHER PUBLICATIONS

International Search Report issued May 11, 2010 in PCT/JP2010/051437 filed Feb. 2, 2010.

*Primary Examiner* — N Drew Richards
*Assistant Examiner* — Peter Bradford
(74) *Attorney, Agent, or Firm* — Oblon, Spivak, McClelland, Maier & Neustadt, L.L.P.

(57) ABSTRACT

According to one embodiment, a nonvolatile semiconductor memory device includes a source region and a drain region provided on a surface area of a semiconductor region, a tunnel insulating film provided on a channel between the source region and the drain region, a charge storage layer provided on the tunnel insulating film, a first dielectric film provided on the charge storage layer and containing lanthanum aluminum silicon oxide or oxynitride, a second dielectric film provided on the first dielectric film and containing oxide or oxynitride containing at least one of hafnium (Hf), zirconium (Zr), titanium (Ti), and a rare earth metal, and a control gate electrode provided on the second dielectric film.

10 Claims, 15 Drawing Sheets

FOREIGN PATENT DOCUMENTS

| JP | 2006-86511 | 3/2006 |
| JP | 2006-203200 | 8/2006 |
| JP | 2008-244163 | 10/2008 |
| JP | 2009-54868 | 3/2009 |
| JP | 2009-164260 | 7/2009 |
| WO | WO 2006/022175 | 3/2006 |

\* cited by examiner

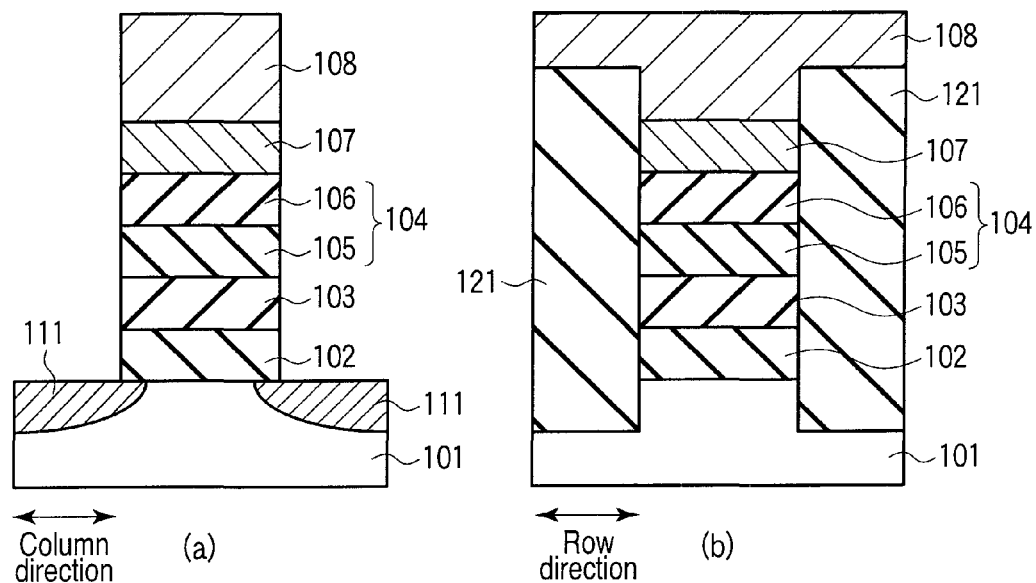
F I G. 1
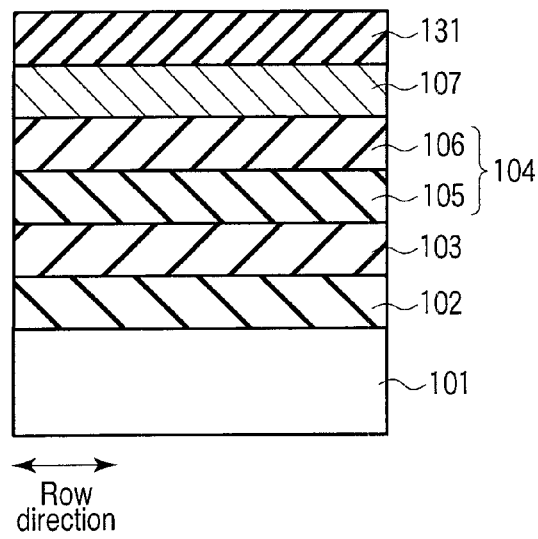
F I G. 2

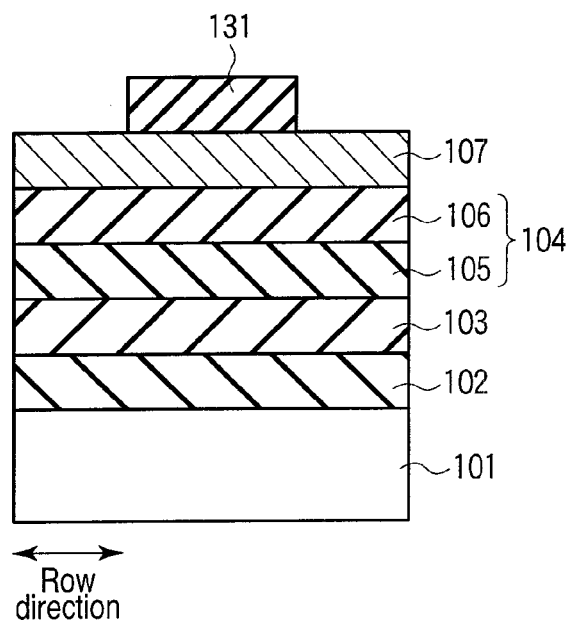
F I G. 3
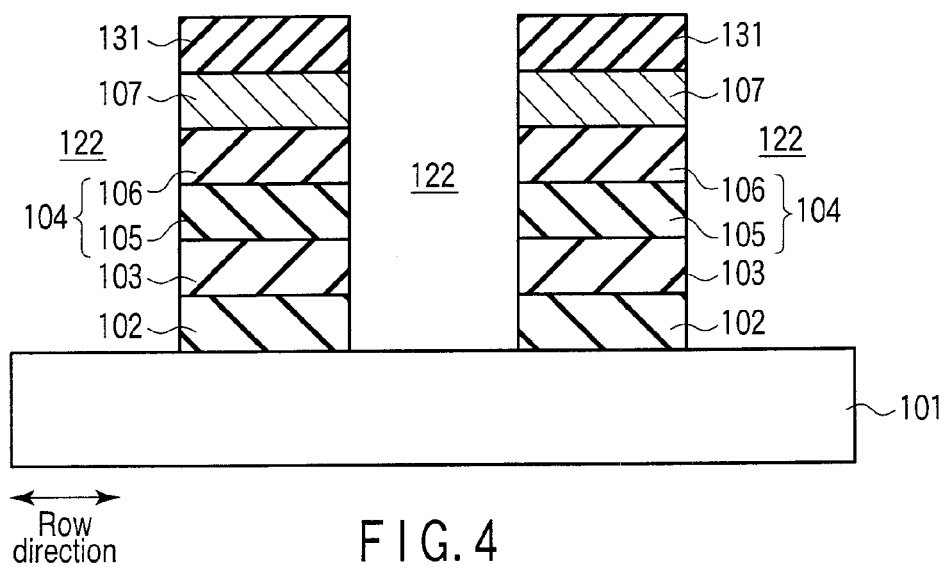
F I G. 4

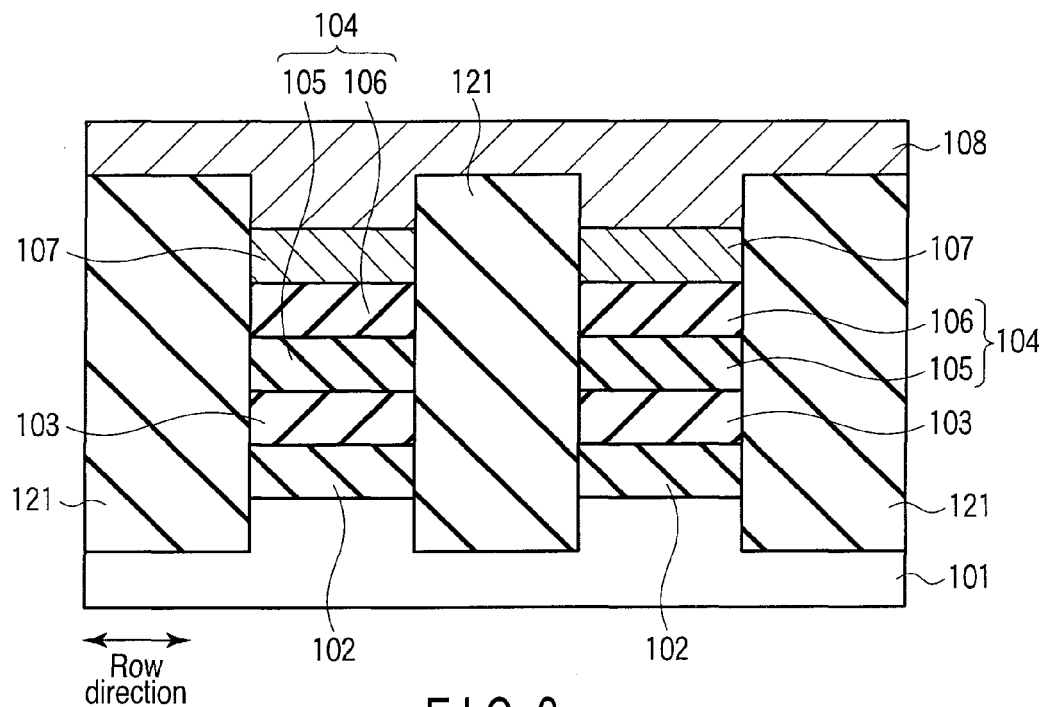
F I G. 9
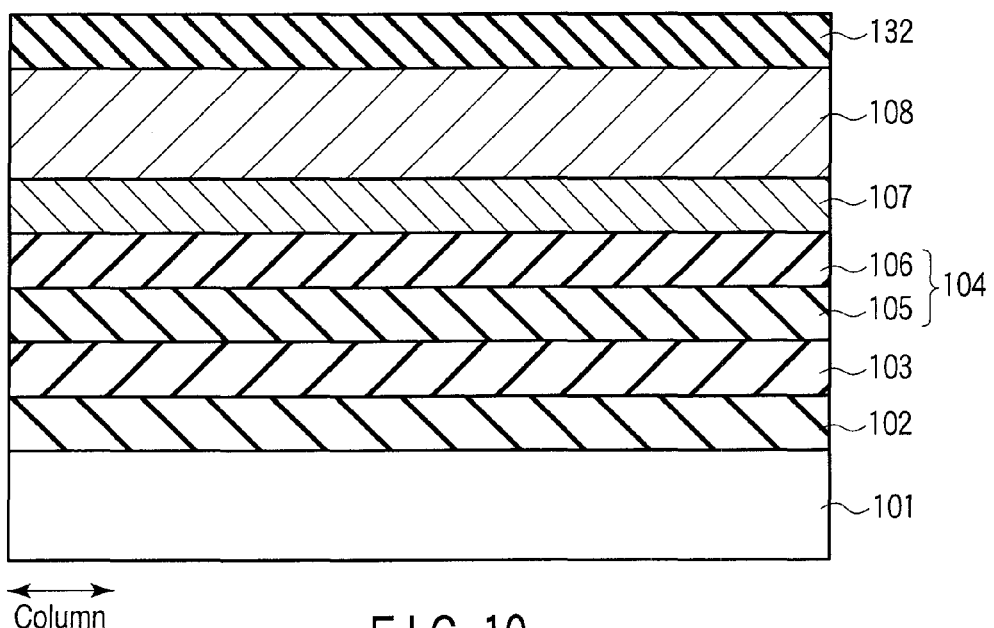
F I G. 10

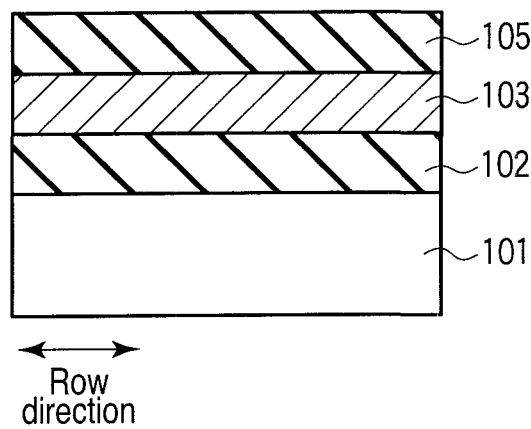
F I G. 17
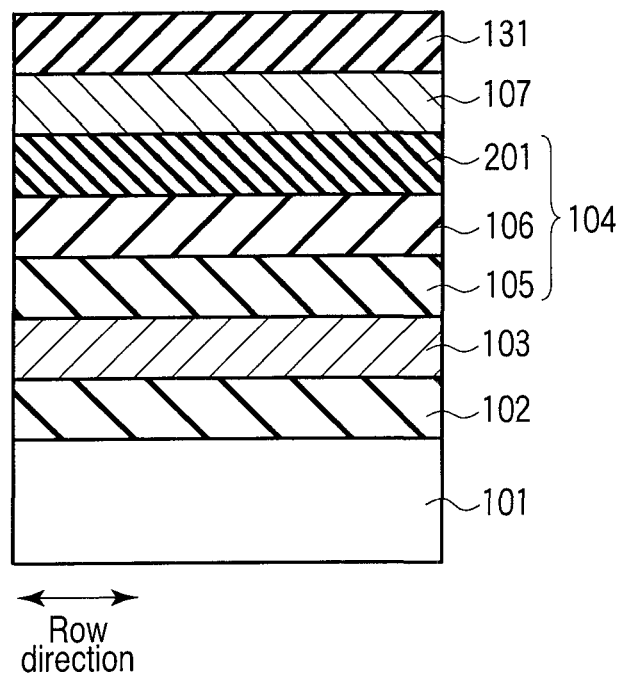
F I G. 18

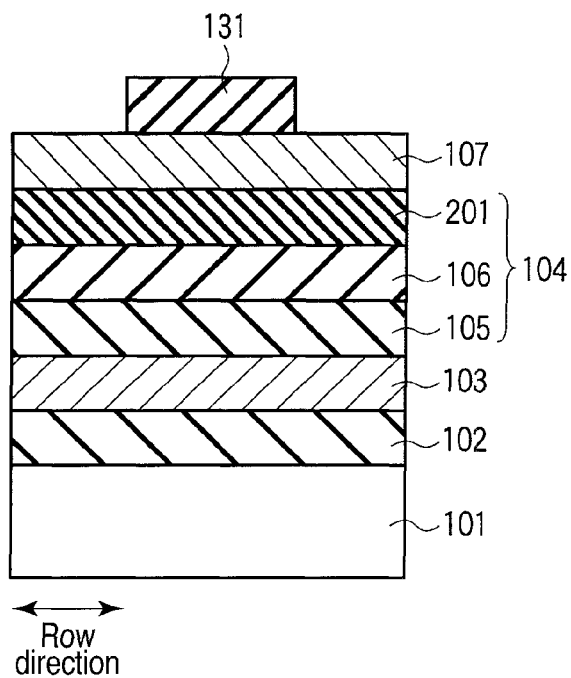
F I G. 19
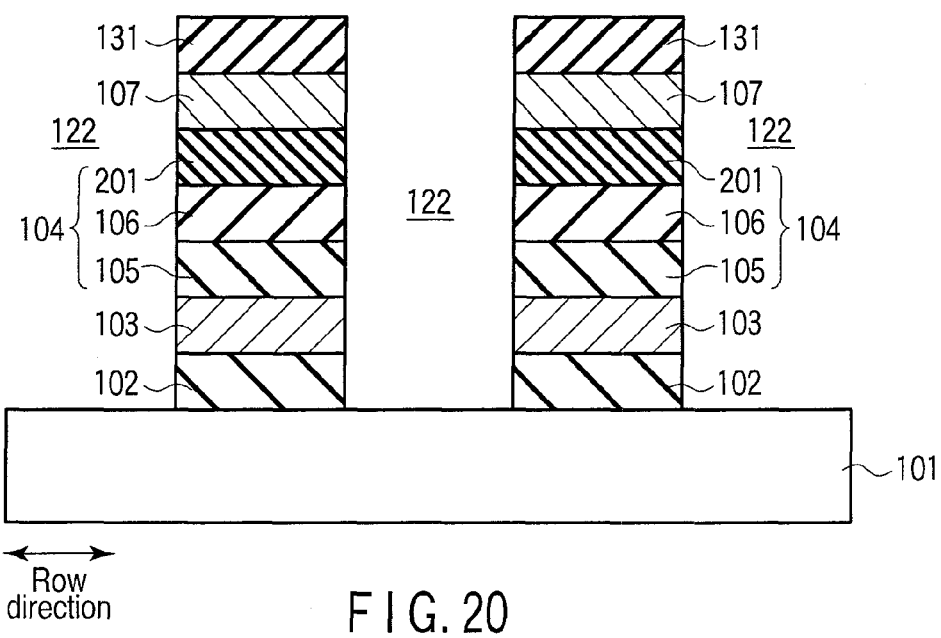
F I G. 20

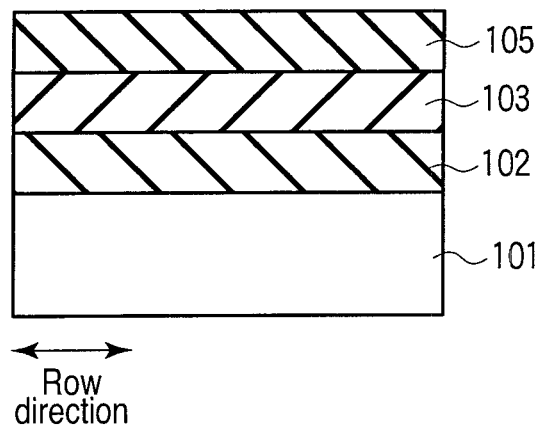
F I G. 24
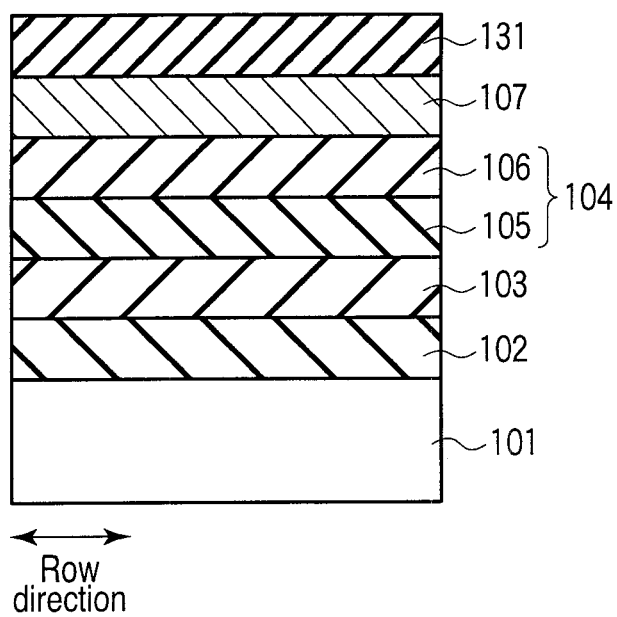
F I G. 25

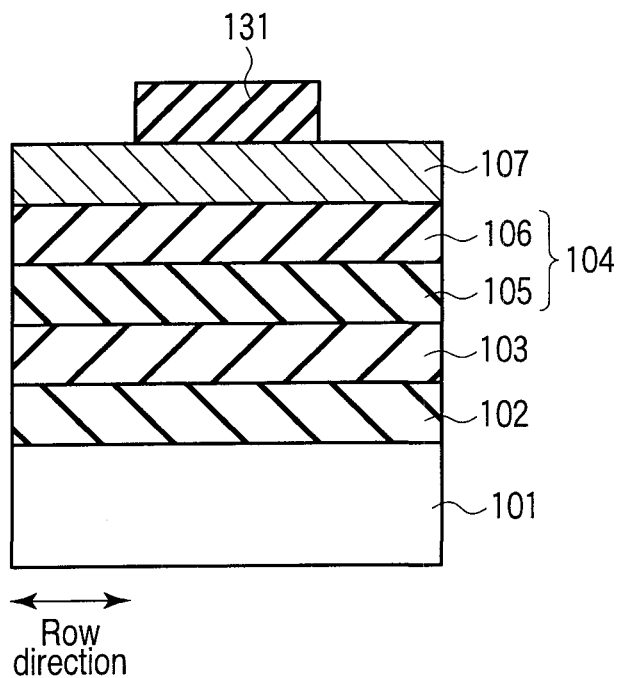
F I G. 26
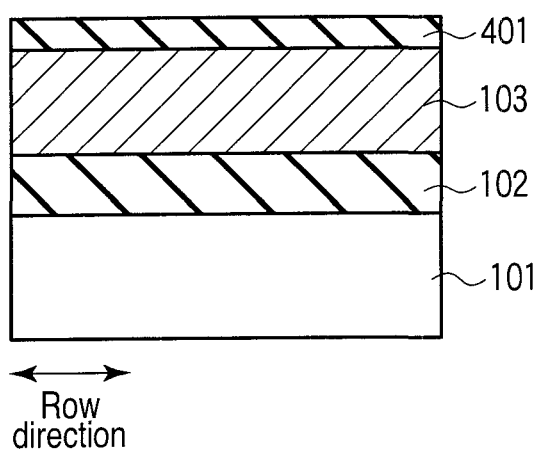
F I G. 27

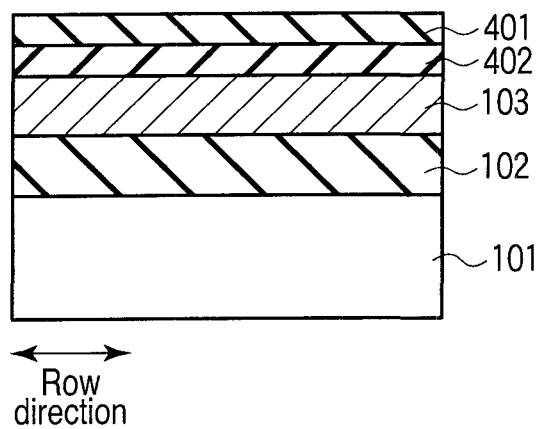
Row direction
F I G. 28
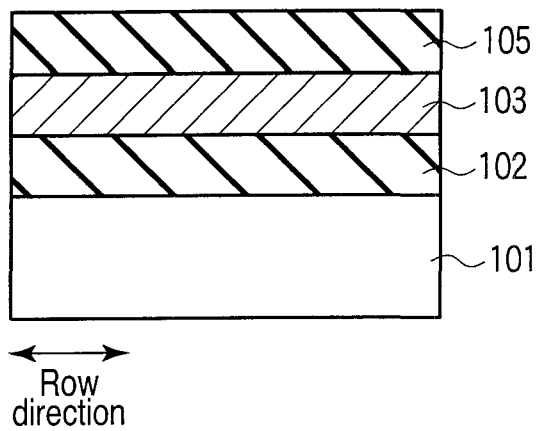
Row direction
F I G. 29

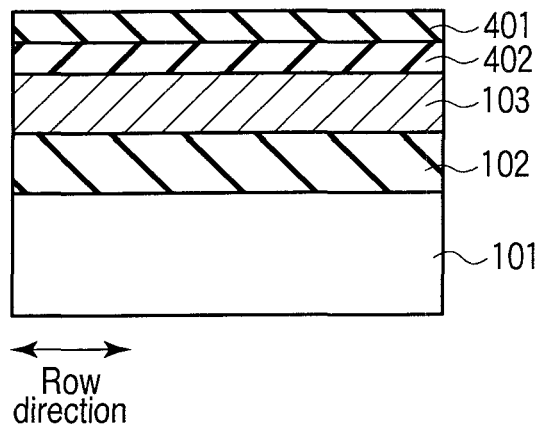
F I G. 30
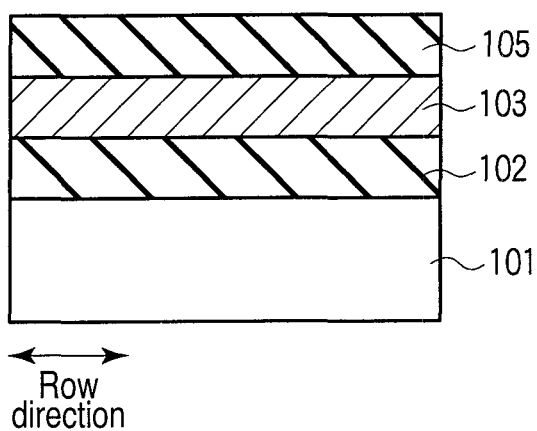
F I G. 31

US 8,482,053 B2

NONVOLATILE SEMICONDUCTOR MEMORY DEVICE WITH HIGH-K INSULATING FILM

CROSS REFERENCE TO RELATED APPLICATIONS

This application is a Continuation Application of PCT Application No. PCT/JP2010/051437, filed Feb. 2, 2010 and based upon and claiming the benefit of priority from prior Japanese Patent Application No. 2009-026603, filed Feb. 6, 2009, the entire contents of all of which are incorporated herein by reference.

FIELD

Embodiments described herein relate generally to a nonvolatile semiconductor memory device and a method for manufacturing the same.

BACKGROUND

A NAND flash memory is known as a kind of nonvolatile semiconductor memory. Each memory cell in the NAND flash memory has a stacked gate structure with a first insulating film, a charge storage layer, a second insulating film, and a control gate electrode stacked on a semiconductor substrate in order. The first insulating film is called a "tunnel insulating film". The second insulating film is called an "inter-gate insulating film" if the charge storage layer is a floating gate electrode comprising polycrystalline silicon and is called a "block insulating film" if the charge storage layer comprises an insulator. Silicon oxide or oxynitride has hitherto been used as the first insulating film and the second insulating film. However, with increasing miniaturization of memory cells, insulating films with increased dielectric constants (high-k film) have been examined.

The high-k film enables a reduction in effective oxide thickness (EOT), with the physical film thickness thereof maintained. Thus, the high-k film allows the memory cells to be miniaturized, while enabling a reduction in the operation voltage of memory elements. Moreover, the high-k film is expected to suppress leakage current, which mainly comprises FN (fowler nordfeim) tunnel current, in the high electric field region. However, compared to the silicon oxide film or the oxynitride film, there is a tendency that oxygen defects are likely to be formed in the high-k film because the high-k film is often formed of a material based mainly on ion bonding instead of covalent bonding. The oxygen defects often form an energy level in a band gap. The energy level may prevent a leakage current in a low electric field region from being suppressed, thus degrading data retention characteristics. Hence, simultaneously improving the leakage current characteristics of both the high and low electric field regions is difficult.

On the other hand, a stacked structure with a silicon oxide film or an oxynitride film and a high-k film has been proposed in order to suppress the leakage current in the low current field region. However, silicon oxide or oxynitride has a small dielectric constant, thus reducing the series capacity of the high-k film and the silicon oxide or oxynitride. This disadvantageously makes a reduction in EOT difficult, resulting in a failure to decrease the operation voltage.

BRIEF DESCRIPTION OF THE DRAWINGS

FIG. 1 is a cross-sectional view illustrating a nonvolatile semiconductor memory device according to a first embodiment;

FIG. 2 is a cross-sectional view illustrating a step of manufacturing a nonvolatile semiconductor memory device according to the first embodiment;

FIG. 3 is a cross-sectional view illustrating a manufacturing step continued from FIG. 2;

FIG. 4 is a cross-sectional view illustrating a manufacturing step continued from FIG. 3;

FIG. 9 is a cross-sectional view illustrating a manufacturing step continued from FIG. 8;

FIG. 10 is a cross-sectional view illustrating a manufacturing step continued from FIG. 9;

FIG. 17 is a cross-sectional view illustrating a manufacturing step continued from FIG. 16;

FIG. 18 is a cross-sectional view illustrating a manufacturing step continued from FIG. 17;

FIG. 19 is a cross-sectional view illustrating a manufacturing step continued from FIG. 18;

FIG. 20 is a cross-sectional view illustrating a manufacturing step continued from FIG. 19;

FIG. 24 is a cross-sectional view illustrating a manufacturing step continued from FIG. 23;

FIG. 25 is a cross-sectional view illustrating a manufacturing step continued from FIG. 24;

FIG. 26 is a cross-sectional view illustrating a manufacturing step continued from FIG. 25;

FIG. 27 is a cross-sectional view illustrating a step of manufacturing a nonvolatile semiconductor memory device according to a fourth embodiment;

FIG. 28 is a cross-sectional view illustrating a manufacturing step continued from FIG. 27;

FIG. 29 is a cross-sectional view illustrating a manufacturing step continued from FIG. 28;

FIG. 30 is a cross-sectional view illustrating a manufacturing step continued from FIG. 29; and FIG. 31 is a cross-sectional view illustrating a manufacturing step continued from FIG. 30.

DETAILED DESCRIPTION

Figure 5:
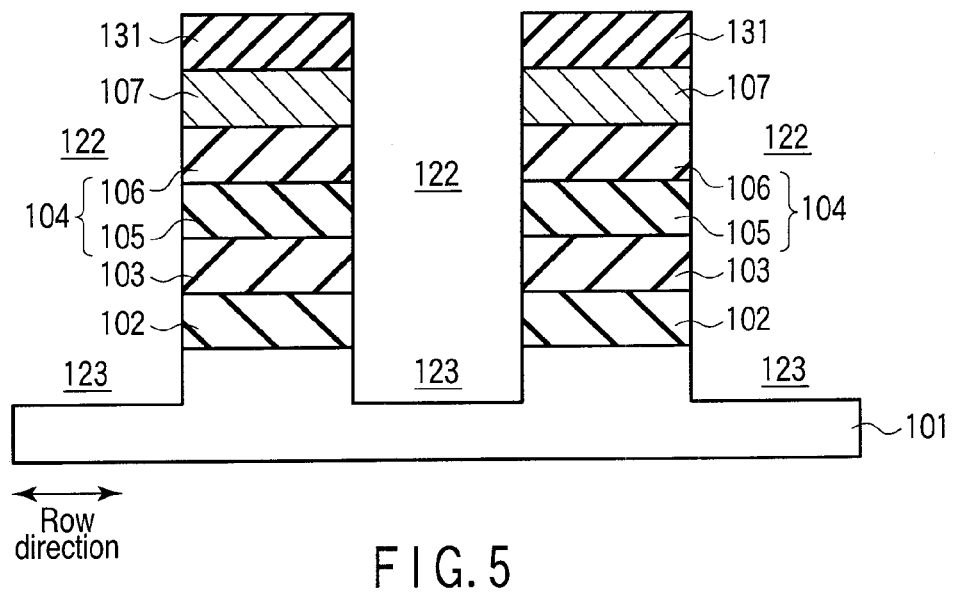
FIG. 5 is a cross-sectional view illustrating a manufacturing step continued from FIG. 4.

In general, according to one embodiment, there is provided a nonvolatile semiconductor memory device comprising:

a source region and a drain region provided on a surface area of a semiconductor region;

a tunnel insulating film provided on a channel between the source region and the drain region;

a charge storage layer provided on the tunnel insulating film;

a first dielectric film provided on the charge storage layer and containing lanthanum aluminum silicon oxide or oxynitride;

a second dielectric film provided on the first dielectric film and containing oxide or oxynitride containing at least one of hafnium (Hf), zirconium (Zr), titanium (Ti), and a rare earth metal; and a control gate electrode provided on the second dielectric film.

Embodiments will be described with reference to the drawings. In the description below, elements with the same functions and configurations are denoted by the same reference numerals. Duplicate descriptions will be given only when required.

[First Embodiment]

(1. Configuration of the Nonvolatile Semiconductor Memory Device)

FIG. 1 is a cross-sectional view showing the configuration of a nonvolatile semiconductor memory device according to a first embodiment. FIG. 1($a$) is a cross-sectional view taken along a channel length direction. FIG. 1($b$) is a cross-sectional view taken along a channel width direction. The channel length direction corresponds to a column direction in which bit lines extend. The channel width direction corresponds to a row direction in which word lines (control gate electrodes) extend. The nonvolatile semiconductor memory device (memory cell) shown in FIG. 1 is a MONOS (metal-oxide-nitride-oxide-semiconductor) type in which a charge storage layer comprises an insulator.

Two source/drain regions (impurity diffusion regions) 111 are provided in a surface area of a p-type semiconductor substrate (or p-type well) 101 so as to be separate from each other. The semiconductor substrate 101 is, for example, a single-crystal silicon substrate. Each of the source/drain regions 111 is formed by doping an n-type dopant in the silicon substrate 101. A channel region is provided between the source/drain regions 111. When the memory cell is turned on, a channel is formed in the channel region so as to make the source/drain regions 111 electrically connected with each other.

A silicon oxide film ($SiO_2$) 102 of thickness about 5 nm is provided on the channel region as a first insulating film (tunnel insulating film) 102. A silicon nitride film ($Si_3N_4$) 103 of thickness about 6 nm is provided on the tunnel insulating film 102 as a charge storage layer 103. A stacked film of a lanthanum aluminum silicon oxide film (first dielectric film) 105 of thickness about 4 nm and a hafnium oxide film (second dielectric film) 106 of thickness about 5 nm is provided on the charge storage layer 103 as a second insulating film (block insulating film) 104. The lanthanum aluminum silicon oxide film 105 is amorphous. The hafnium oxide film 106 is crystallized (the hafnium oxide film 106 has a single-crystal or polycrystalline structure). A tantalum nitride film 107 is provided on the block insulating film 104 as a control gate electrode 107. A tungsten film 108 is provided on the control gate electrode 107 as a low-resistance metal film 108.

As shown in FIG. 1($b$), a plurality of the stacked gate structures each comprising the insulating film 102, the charge storage layer 103, the block insulating film 104, and the control gate electrode 107 are provided in a row direction. The stacked gate structures are separated from one another by isolation layers 121 of an STI (Shallow Trench Isolation) structure. Silicon oxide is used as the isolation layer 121. The isolation layer 121 fills a slit-like trench with a depth from a top surface of the control gate electrode 107 to the silicon substrate 101 (the depth is, for example, about 10 nm). The top surface of the isolation layer 121 coincides substantially with the top surface of the control gate electrode 107. The tungsten film 108 extends in the row direction to function as a word line.

An oxide or an oxynitride containing at least one of hafnium (Hf), zirconium (Zr), titanium (Ti) and a rare earth metal may be used as the second dielectric film 106 comprising a high-dielectric constant material. Furthermore, at least one of silicon (Si) and aluminum (Al) may be added to the high-dielectric constant material. The addition of at least one of silicon (Si) and aluminum (Al) enables a reduction in traps, which are electrical defects in the second dielectric film 106. This enables a reduction in leakage current in the nonvolatile semiconductor memory device and suppression of a variation in threshold voltage.

The silicon oxide film as the tunnel insulating film 102 is desirably 2 to 8 nm in thickness. In the present embodiment, silicon oxide is used as the tunnel insulating film 102. However, instead of the silicon oxide, silicon oxynitride may be used as the tunnel insulating film 102. The use of the silicon oxynitride allows potential barriers to electrons and holes to be reduced, thus effectively increasing the speed of operations of writing and erasing data to and from memory cells. Furthermore, a stacked tunnel insulating film such as a silicon oxide film/silicon nitride film/silicon oxide film (ONO) film may be used as the tunnel insulating film. The element on the right of "/" indicates a lower layer, whereas the element on the left of "/" indicates an upper layer.

The silicon nitride film as the charge storage layer 103 is desirably about 3 to 9 nm in thickness. The silicon nitride film 103 need not necessarily be $Si_3N_4$ with a stoichiometric composition. The silicon nitride film 103 may have an Si-rich composition in order to increase an intra-film trap density or have a nitride-rich composition in order to deepen a trap level. Furthermore, the silicon nitride film 103 need not necessarily have a uniform configuration. The silicon nitride film may be a stacked film or a continuous film in which the ratio of silicon to nitride varies in a film thickness direction. Additionally, instead of the silicon nitride film, a silicon oxynitride film containing a certain amount of oxygen may be used as the charge storage layer 103.

Alternatively, the charge storage layer 103 may be n-type polycrystalline silicon doped with an n-type dopant [phosphorous (P) or arsenic (As)] or p-type polycrystalline silicon doped with p-type dopant [boron (B)]. Moreover, the charge storage layer 103 may be a high-dielectric constant material containing an oxide or oxynitride containing at least one of aluminum (Al), hafnium (Hf), zirconium (Zr), and titanium (Ti). Examples of the high-dielectric constant material include $Al_2O_3$, $HfO_2$, HfON, $HfSiO_x$, HfSiON, $HfAlO_x$, HfAlON, $ZrO_2$, ZrON, $ZrSiO_x$, ZrSiON, $ZrAlO_x$, ZrAlON, $TiO_2$, TiON, $TiSiO_x$, TiSiON, $TiAlO_x$, and TiAlON. Furthermore, the above-listed high-dielectric constant materials with lanthanum (La) addition may be used such as $LaHfSiO_x$, $HfLaO_x$, $LaZrSiO_x$, $ZrLaO_x$, $LaTiSiO_x$, and $TiLaO_x$. In addition, the charge storage layer 103 may be a stacked film or a continuous film comprising silicon nitride and the above-listed high-dielectric constant material.

In the present embodiment, the tantalum nitride film is used as the control gate electrode 107. However, the gate electrode 107 may be n-type polycrystalline silicon doped with an n-type dopant [phosphorous (P) or arsenic (As)] or p-type polycrystalline silicon doped with p-type dopant [boron (B)]. Moreover, the charge storage layer 103 may be transition metal silicide or a nitride containing at least one of a, aluminum (Al), titanium (Ti), and tantalum (Ta). Moreover, the control gate electrode 107 may be any of the following metal-containing conductive materials in (1) to (7).

(1) A material containing at least one of element selected from a group comprising platinum (Pt), tungsten (W), iridium (Ir), ruthenium (Ru), rhenium (Re), molybdenum (Mo), titanium (Ti), tantalum (Ta), nickel (Ni), and cobalt (Co).

(2) A silicide of a material containing at least one of element selected from a group comprising platinum (Pt), tungsten (W), titanium (Ti), tantalum (Ta), nickel (Ni), and cobalt (Co).

(3) A carbide of a material containing at least one of element selected from a group comprising tungsten (W), titanium (Ti), and tantalum (Ta).

(4) A nitride of a material containing at least one of element selected from a group comprising tungsten (W), molybdenum (Mo), titanium (Ti), and tantalum (Ta).

(5) A silinitride of a material containing titanium (Ti).

(6) An oxide of a material containing at least one of element selected from a group comprising iridium (Ir) and ruthenium (Ru).

(7) A compound or mixture of any of the materials in (1) to (6) listed above.

Now, the composition ratio of the lanthanum (La), aluminum (Al), and silicon (Si) contained in the lanthanum aluminum silicon oxide film 105 will be explained. For notation of the composition ratio, a value obtained by dividing the sum of La and Al by Si is represented as "(La+Al)/Si".

When (La+Al)/Si<1, the lanthanum aluminum silicon oxide is separated from the silicon oxide. That is, there is a limit beyond which silicon cannot be dissolved into the lanthanum silicon oxide. Furthermore, when 4<(La+Al)/Si, the lanthanum aluminum oxide and the lanthanum aluminum silicon oxide film undergo phase separation, resulting in a variation in film thickness. This is a factor that makes electrical characteristics unstable. Thus, the range of the composition ratio is desirably $1 \leq (La+Al)/Si \leq 4$.

Furthermore, when the composition ratio of La and Al indicates La richness or Al richness, the lanthanum aluminum silicon oxide film 105 is crystallized between 900° C. and 1,000° C. The crystallized lanthanum aluminum silicon oxide film 105 prevents a leakage current in a low electric field region from being suppressed. The range of the composition ratio within which the crystallization can be reliably suppressed is $0.5 \leq La/Al \leq 2$. However, this condition is illustrative, and the crystallization can also be suppressed by doping nitrogen into the lanthanum aluminum silicon oxide or appropriately setting a heating temperature.

Furthermore, the Al rich composition serves to reduce the dielectric constant. Thus, the La rich composition is preferable for suppressing a decrease in composition ratio. That is, the composition ratio of La and Al is desirably $1 \leq La/Al \leq 2$. Moreover, to suppress the moisture or carbon dioxide absorbency of La, La needs to react with Al or Si. Hence, desirably, $La/(Al+Si) \leq 1$.

Additionally, if the lanthanum aluminum oxide or oxynitride is La rich before being mixed with a silicon oxide or an oxynitride, the moisture or carbon dioxide is likely to be absorbed before being mixed. Thus, if the mixture process is used, the composition ratio La/Al in which a more stable lanthanum aluminum silicon oxide film can be formed is desirably close to 1.

(2. Method for Manufacturing a Nonvolatile Semiconductor Memory Device)

Now, a method for manufacturing a nonvolatile semiconductor memory device according to the first embodiment will be described. In the drawings used to describe the manufacturing method, FIGS. 2 to 9 are cross-sectional views taken along a channel width direction (row direction). FIGS. 10 to 13 are cross-sectional views taken along a channel length direction (column direction).

First, as shown in FIG. 2, after the surface of the p-type silicon substrate 101 is cleaned, a silicon oxide film (tunnel insulating film) 102 of thickness about 5 nm is formed by a thermal oxidation method within a temperature range from 800° C. to 1,000° C. Subsequently, a silicon nitride film (charge storage layer) 103 of thickness about 6 nm is formed on the silicon oxide film 102 by an LPCVD (low pressure chemical vapor deposition) method using dichlorosilane ($SiH_2Cl_2$) and ammonia ($NH_3$) within a temperature range from 600° C. to 800° C.

Subsequently, a lanthanum aluminum silicon oxide film 105 of thickness about 5 nm is formed by a sputtering method within a temperature range from the room temperature to 700° C., as the first dielectric film 105 included in the block insulating film 104. The resultant structure is then subjected to a heating process in the rapid heating furnace at 900 to 1,050° C. At this time, the lanthanum aluminum silicon oxide film 105 remains amorphous. Then, a hafnium oxide film 106 of thickness 5 nm and a tantalum nitride film (control gate electrode) 107 of thickness 5 nm are deposited in order by the sputtering method within a temperature range from the room temperature to 700° C., as the second dielectric film 106 included in the block insulating film 104.

Subsequently, a mask material 131 for processing of isolation regions is deposited on the tantalum nitride film 107. Then, a photo resist (not shown in the drawings) is formed on the mask material 131 and then exposed and developed. As shown in FIG. 3, the pattern of the photo resist is transferred to the mask material 131 by an RIE (reactive ion etching) method. Thereafter, the photo resist is removed.

Subsequently, as shown in FIG. 4, the tantalum nitride film 107, the hafnium oxide film 106, the lanthanum aluminum silicon oxide film 105, the silicon nitride film 103, and the silicon oxide film 102 are etched in order by the RIE method through the mask material 131 as a mask to form slits 122 that separate memory cells arranged adjacent to one another in the row direction. Then, as shown in FIG. 5, the p-type silicon substrate 101 is etched by the RIE method to form isolation trenches 123 of thickness about 100 nm in the p-type silicon substrate 101.

Figure 6:
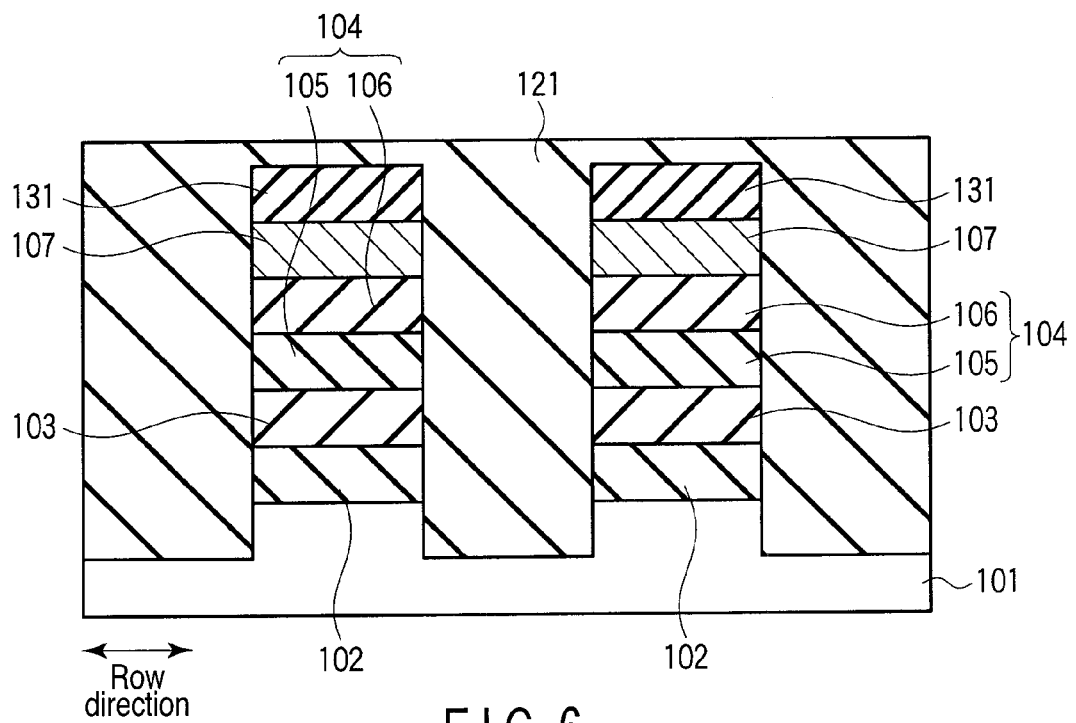
FIG. 6 is a cross-sectional view illustrating a manufacturing step continued from FIG. 5.
Figure 7:
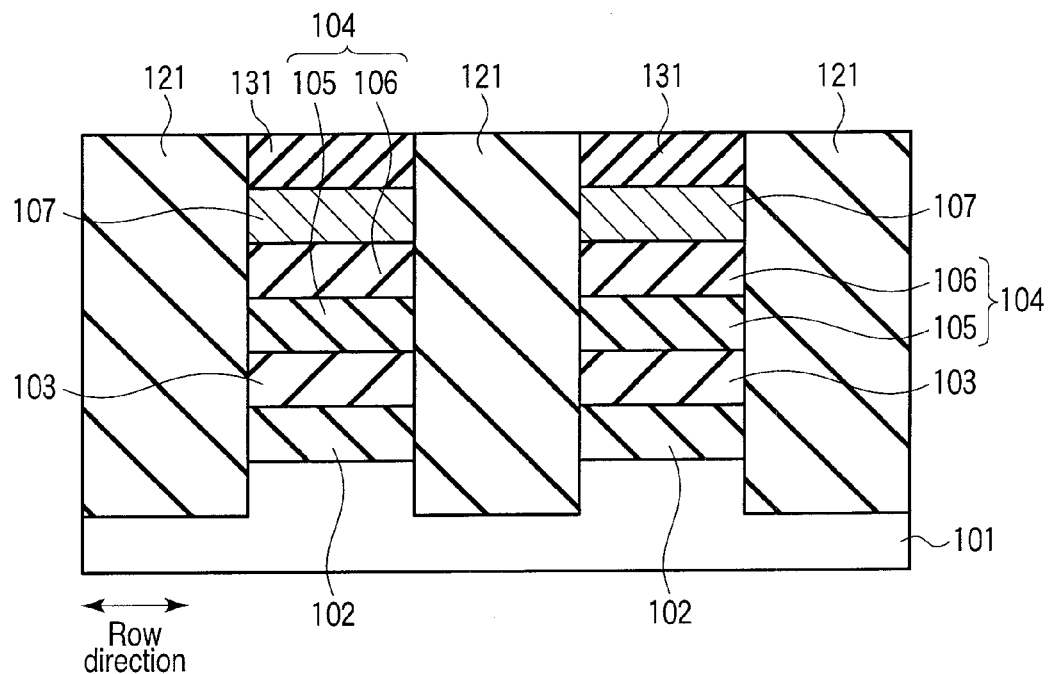
FIG. 7 is a cross-sectional view illustrating a manufacturing step continued from FIG. 6.
Figure 8:
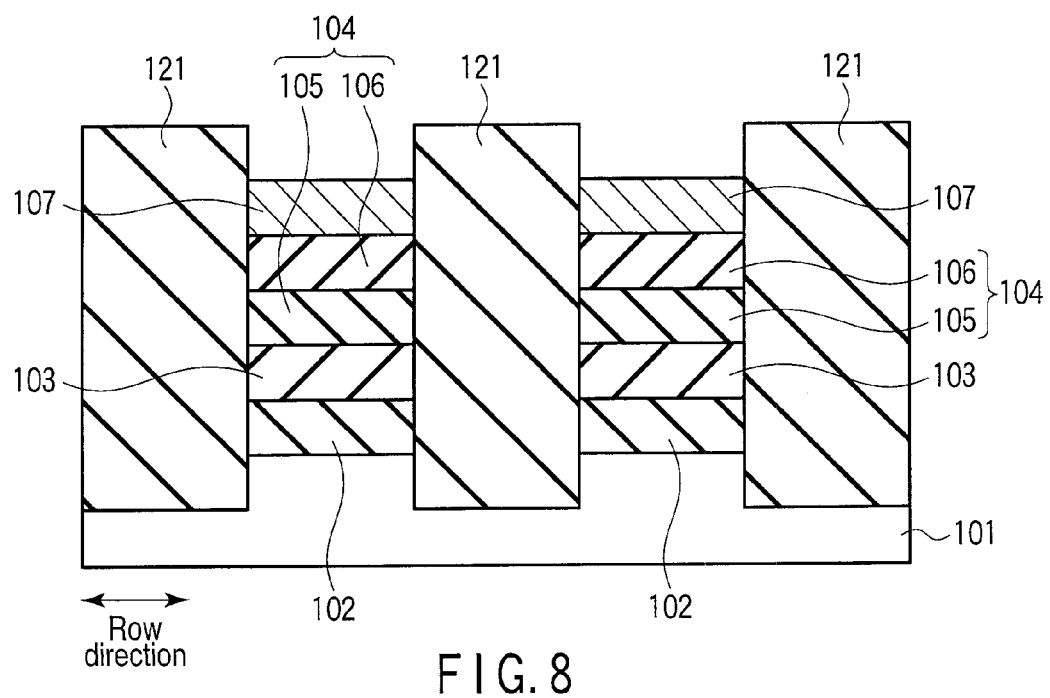
FIG. 8 is a cross-sectional view illustrating a manufacturing step continued from FIG. 7.

Subsequently, as shown in FIG. 6, a silicon oxide film (isolation layer) 121 that fills the slits 122 and the isolation trenches 123 is formed by a CVD method. Then, as shown in FIG. 7, the silicon oxide film 121 is polished by a CMP (chemical mechanical polishing) method until the mask material 131 is exposed, thus flattening the top surface of the silicon oxide film 121. Thereafter, as shown in FIG. 8, the mask material 131 is removed.

Subsequently, as shown in FIG. 9, a tungsten film (word line) 108, which is a low-resistance metal film of thickness about 100 nm, is formed on the tantalum nitride film (control gate electrode) by the CVD method using WF$_6$ or W(CO)$_6$ as a material gas within a temperature range from 400° C. to 600° C.

Figure 11:
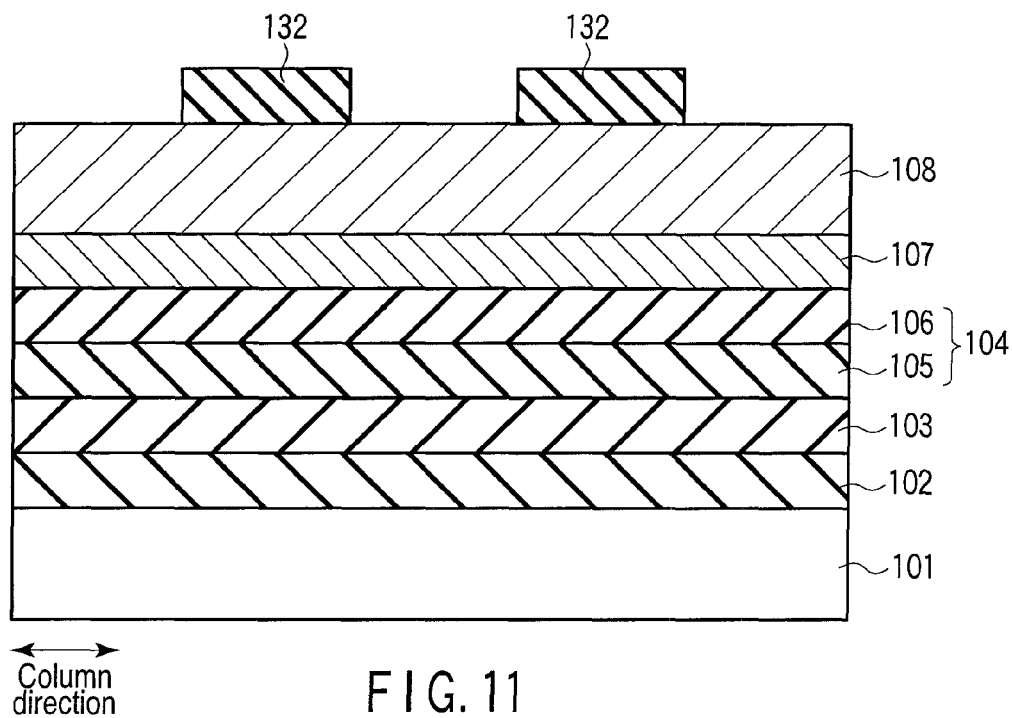
FIG. 11 is a cross-sectional view illustrating a manufacturing step continued from FIG. 10.

Subsequently, as shown in FIG. 10, a mask material 132 is formed on the tungsten film 108 by the CVD method. A photo resist (not shown in the drawings) is formed on the mask material 132 and then exposed and developed. Then, as shown in FIG. 11, the pattern of the photo resist is transferred to the mask material 132 by the RIE method. Thereafter, the photo resist is removed.

Figure 12:
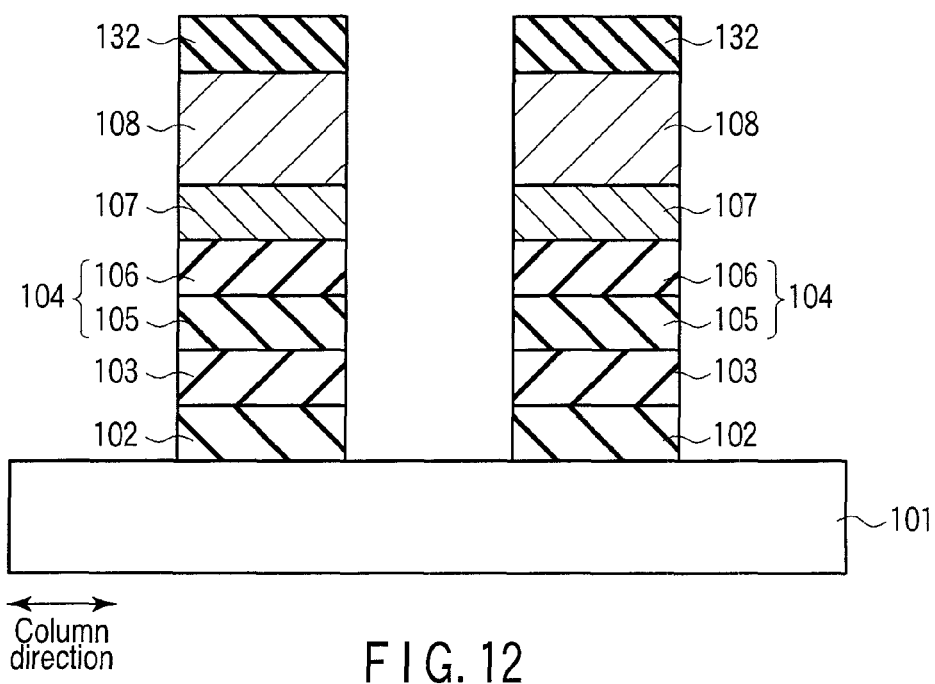
FIG. 12 is a cross-sectional view illustrating a manufacturing step continued from FIG. 11.

Subsequently, as shown in FIG. 12, the tungsten film 108, the tantalum nitride film 107, the hafnium oxide film 106, the lanthanum aluminum silicon oxide film 105, the silicon nitride film 103, and the silicon oxide film 102 are sequentially etched by the RIE method through the mask material 132 as a mask to form a MONOS stacked gate structure.

Figure 13:
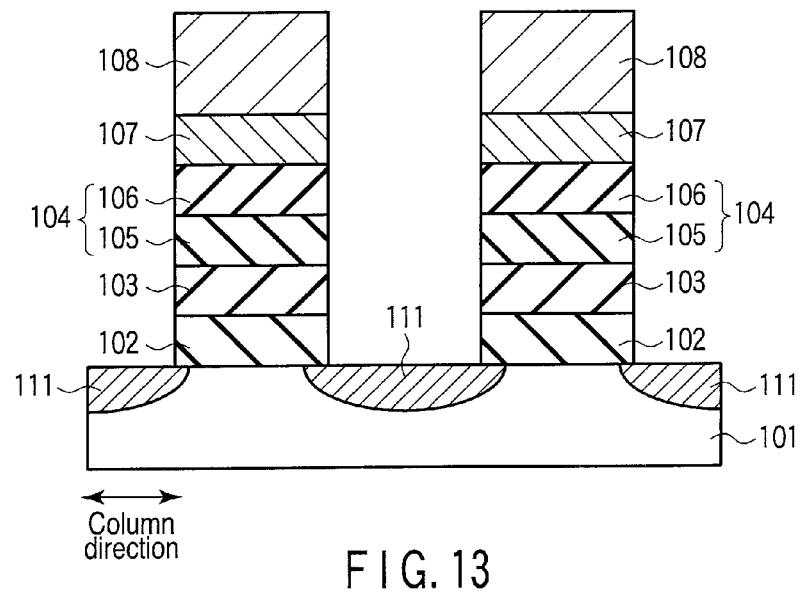
FIG. 13 is a cross-sectional view illustrating a manufacturing step continued from FIG. 12.

Subsequently, a side wall (not shown in the drawings) comprising, for example, silicon oxide is formed on side surfaces of the stacked gate structure by the CVD method. Then, as shown in FIG. 13, impurity regions 111 are formed in a surface area of the p-type silicon substrate 101 in a self-alignment manner by an ion implantation method using phosphorous (P) as a donor. Subsequently, the sample is subjected to a thermal treatment at about 900° C. to activate the impurity regions 111 to form source/drain regions 111. By this thermal treatment, the hafnium oxide film 106 is crystallized. Finally, an interlayer insulating film (not shown in the drawings) covering the memory cells is formed by the CVD method. Thus, the nonvolatile semiconductor memory device according to the present embodiment is manufactured.

The above-described manufacturing method is only illustrative. The nonvolatile semiconductor memory device may be formed by any other manufacturing method. For example, to thermally oxidize the tunnel insulating film 102, various methods such as dry O$_2$ oxidation, wet oxidation (hydrogen combustion and oxidation), and plasma oxidation using O$_2$ or H$_2$O as a material gas may be used. Moreover, a step of applying NO gas, NH$_3$ gas, or nitrogen plasma may be carried out before or after the thermal oxidation to form a nitrided silicon oxide film (silicon oxynitride film).

Furthermore, the composition of the silicon nitride film used as the charge storage layer 103 can be varied by adjusting the flow ratio of dichlorosilane (SiH$_2$Cl$_2$) and ammonia (NH$_3$), which are material gases for the LPCVD method. Additionally, the lanthanum aluminum silicon oxide film 105, the hafnium oxide film 106, and the tantalum nitride film 107 may be formed by, instead of the sputtering method, any of a PLD (pulsed laser deposition) method, an MBE (molecular beam epitaxy) method, a CVD method, a MOCVD (metal organic chemical vapor deposition) method, and an ALD (atomic layer deposition) method.

Moreover, the material gas for the CVD method may be replaced with another gas. Additionally, the CVD method may be replaced with the sputtering method. In addition, the films of the above-described NOMOS stacked gate structure can be formed by, instead of the CVD method or the sputtering method, a deposition method, a laser ablation method, an MBE method, and a combination of any of these methods.

(3. Effects)

In the first embodiment, the stacked film of the lanthanum aluminum silicon oxide film (first dielectric film) 105 and the hafnium oxide film (second dielectric film) 106 is used as the second insulating film (block insulating film) 104. In the step of forming the source/drain regions, the thermal treatment is carried out at a high temperature of 900 to 1,100° C. in order to activate impurities implanted into the silicon substrate. However, the lanthanum aluminum silicon oxide film 105 can remain amorphous even with the high-temperature thermal treatment. Hence, using the lanthanum aluminum silicon oxide film 105 as a part of the block insulating film 104 enables a reduction in current leaking via the lanthanum aluminum silicon oxide film 105 in connection with crystal grain boundaries on a low electric field side. This allows the retention characteristics of the nonvolatile semiconductor memory device to be improved.

Furthermore, even with the high-temperature thermal treatment at 900 to 1100° C., the lanthanum aluminum silicon oxide film 105 is unlikely to mix with a layer containing silicon (polycrystalline silicon, silicon oxide, silicon nitride, or silicon oxynitride). This serves to prevent a low-dielectric constant reaction layer mainly comprising silicon and oxygen from being formed at the interface between the layer containing silicon (for example, the charge storage layer 103) and the lanthanum aluminum silicon oxide film 105. As a result, direct junction can be maintained between the charge storage layer 103 and the lanthanum aluminum silicon oxide film 105. This enables an increase in the equivalent oxide thickness (EOT) of the block insulating film 104.

Additionally, the lanthanum aluminum silicon oxide film 105 has a large band gap of about 7.3 to 7.6 eV and a high dielectric constant of about 10 to 12. The limited ranges of values depend on the composition ratio of lanthanum (La), aluminum (Al), and silicon (Si). Thus, because the potential barrier between the charge storage layer 103 and the lanthanum aluminum silicon oxide film 105 becomes high, an electron trap efficiency is improved. That is, a write efficiency is improved.

In addition, EOT of the block insulating film 104 can be reduced by using the hafnium oxide film 106, which is a high-dielectric constant insulating film, as a part of the block insulating film 104. This enables a reduction in the operation voltage (write voltage and erase voltage) of the memory cells. Moreover, the dielectric constant of the whole block insulating film 104 increases to enable a reduction in current leaking via the block insulating film 104 in a high electric field region.

(4. Reference Example)

Figure 14:
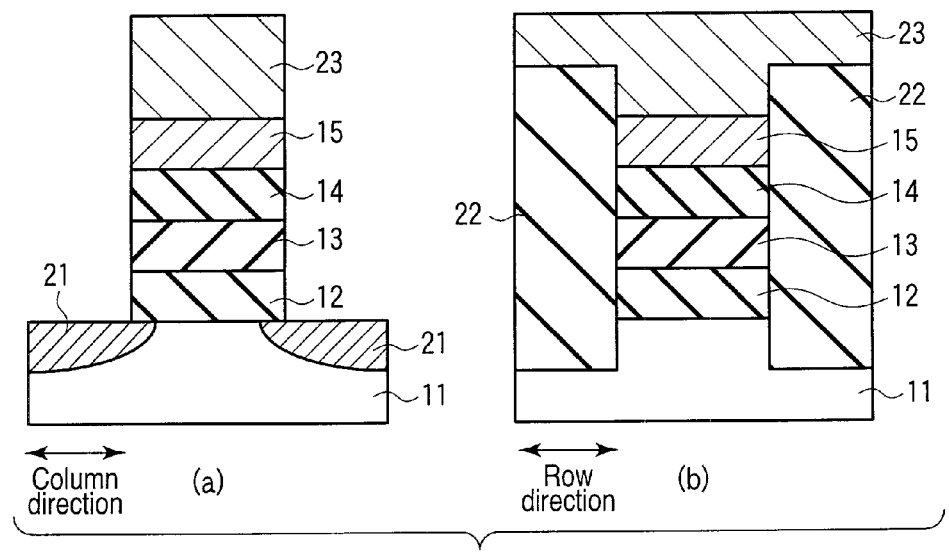
FIG. 14 is a cross-sectional view illustrating a nonvolatile semiconductor memory device according to a reference example.

A reference example of the nonvolatile semiconductor memory device will be described below. FIG. 14 is a cross-sectional view showing the configuration of the nonvolatile semiconductor memory device according to the reference example. FIG. 14(a) is a cross-sectional view taken along the channel length direction (column direction). FIG. 14(b) is a cross-sectional view taken along the channel width direction (row direction).

Two source/drain regions 21 are provided in the surface area of a p-type silicon substrate 11 so as to be separate from each other. A silicon oxide film 12 of thickness about 4 nm is provided on the channel region between the source/drain regions 21 as a first insulating film (tunnel insulating film) 12. A silicon nitride film 13 of thickness about 6 nm is provided on the silicon oxide film 12 as a charge storage layer 13. An aluminum oxide film 14 of thickness about 15 nm is provided on the silicon nitride film 13 as a second insulating film (block insulating film) 14. A polycrystalline silicon film 15 having a thickness of about 100 nm and doped with boron (B) is provided on the aluminum oxide film 14 as a control gate electrode 15.

As shown in FIG. 14(b), a plurality of stacked gate structures each comprising the polycrystalline oxide film 12, the silicon nitride film 13, the aluminum oxide film 14, and the polycrystalline silicon film 15 are formed in the row direction. The stacked gate structures are separated from one another by isolation layers 22 of an STI structure. A word line 23 extending in the row direction is provided on the polycrystalline silicon film 15 and the isolation layers 22. The word line 23 comprises a conductive film formed of, for example, tungsten and having a thickness of about 100 nm.

In the reference example configured as described above, the block insulating film 14 is aluminum oxide as a kind of high-k film, and thus the leakage current in the low electric field region caused by intra-film defects is nonnegligible. Thus, the retention characteristics of the memory cells may be degraded, precluding the reliability of the flash memory from being kept for a long time. Furthermore, an interface reaction layer is easily formed, during formation or annealing of the block insulting film 14, at the interface between the block insulating film 14 and the control gate electrode 15 and at the interface between the block insulating film 14 and the charge storage layer 13. As a result, EOT of the block insulating film 14 is likely to increase. In contrast, the memory cells according to the present embodiment allow the problems with the reference example to be solved.

[Second Embodiment]

According to a second embodiment, even if polycrystalline silicon or the like is used as the control gate electrode 107 on the second insulating film 104, the electrical characteristics of the second insulating film 104 and the control gate electrode 107 are prevented from being degraded. To achieve this, the second insulating film 104 comprises a lanthanum aluminum silicon oxide film at the interface between the second insulating film 104 and the control gate electrode 107.

(1. Configuration of the Nonvolatile Semiconductor Memory Device)

Figure 15:
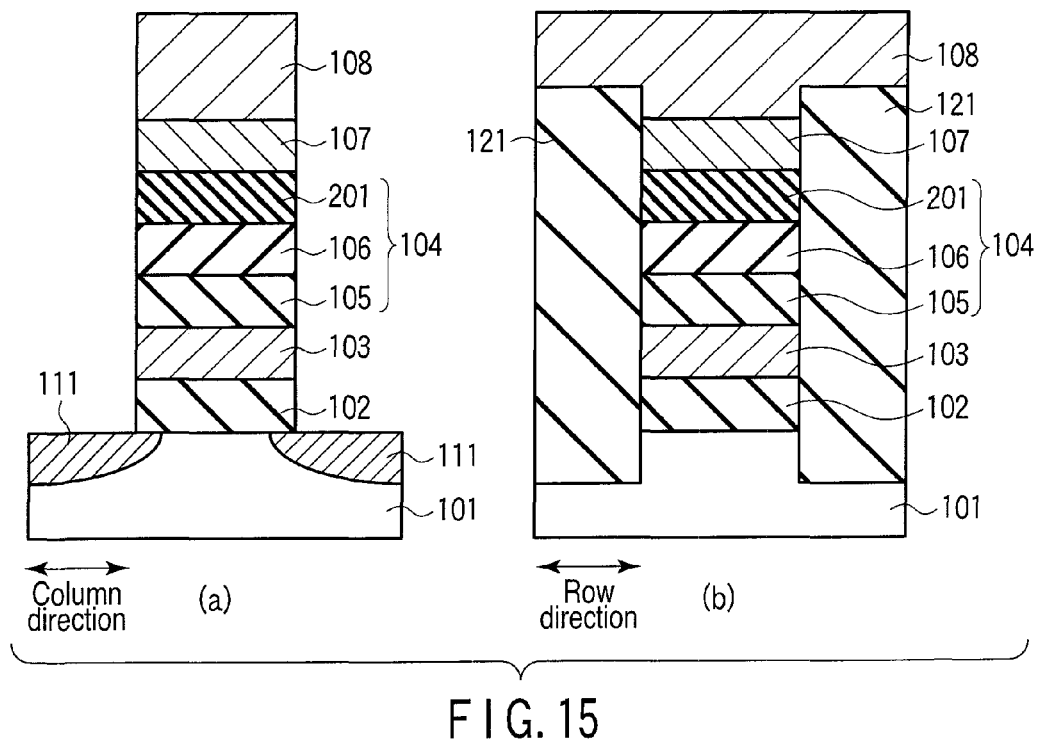
FIG. 15 is a cross-sectional view illustrating a nonvolatile semiconductor memory device according to a second embodiment.

FIG. 15 is a cross-sectional view showing the configuration of a nonvolatile semiconductor memory device according to a second embodiment. FIG. 15(a) is a cross-sectional view taken along the channel length direction (column direction). FIG. 15(b) is a cross-sectional view taken along the channel width direction (row direction).

For example, a silicon oxide film 102 of thickness about 8 nm is provided on the channel region between source/drain regions 111 as a first insulating film (tunnel insulating film). A polycrystalline silicon layer 103 of thickness about 6 nm is provided on the tunnel insulating film 102 as a charge storage layer (floating gate electrode) 103. That is, the nonvolatile semiconductor memory device according to the second embodiment is a floating gate memory cell using a conductor as the charge storage layer.

A stacked film is provided on the charge storage layer 103 as a second insulating film (inter-gate insulating film) 104; the stacked film comprises a lanthanum aluminum silicon oxide film (first dielectric film) 105 of thickness about 3 nm, a lanthanum hafnium oxide film (second dielectric film) 106 of thickness about 6 nm, and a lanthanum aluminum silicon oxide film (third dielectric film) 201 of thickness about 3 nm. The lanthanum aluminum silicon oxide films 105 and 201 are amorphous. The hafnium oxide film 106 is crystallized (the hafnium oxide film 106 has a single-crystal or polycrystalline structure). Preferable conditions for the composition ratio of the lanthanum (La), aluminum (Al), and silicon (Si) contained in the lanthanum aluminum silicon oxide film 201 are the same as those in the lanthanum aluminum silicon oxide film 105 described in the first embodiment.

A polycrystalline silicon layer 107 doped with phosphorous (P) is provided on the inter-gate insulating film 104 as a control gate electrode 107. A tungsten film 108 is provided on the control gate electrode 107 as a low-resistance metal film 108.

As shown in FIG. 15(b), a plurality of the stacked gate structures are provided in a row direction; each of the stacked gate structures comprises the insulating film 102, the charge storage layer 103, the block insulating film 104, and the control gate electrode 107. The stacked gate structures are separated from one another by isolation layers 121 of the STI structure. Silicon oxide is used as the isolation layer 121. The tungsten film 108 extends in the row direction to function as a word line.

The silicon oxide film serving as the tunnel insulating film 102 is desirably about 5 to 10 nm in thickness. In the present embodiment, the silicon oxide is used as the tunnel insulating film 102. However, instead of the silicon oxide, silicon oxynitride or an ONO film may be used.

The polycrystalline silicon layer 103 serving as the floating gate electrode is desirably about 2 to 10 nm in thickness. Instead of the n-type polycrystalline silicon doped with the n-type dopant [phosphorous (P) or arsenic (As)], p-type polycrystalline silicon doped with a p-type dopant [boron (B)] may be used. Moreover, any of the materials illustrated in the first embodiment may be used as the control gate electrode.

(2. Method for Manufacturing a Nonvolatile Semiconductor Memory Device)

Now, a method for manufacturing a nonvolatile semiconductor memory device according to the second embodiment will be described. FIGS. 16 to 20, used to describe the manufacturing method, are cross-sectional views taken along the channel width direction (row direction).

Figure 16:
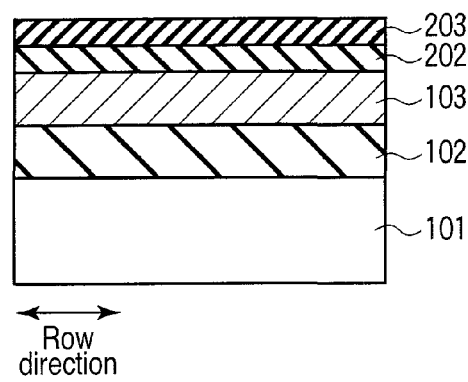
FIG. 16 is a cross-sectional view illustrating a step of manufacturing a nonvolatile semiconductor memory device according to the second embodiment.

First, as shown in FIG. 16, after the surface of the p-type silicon substrate 101 is cleaned, a silicon oxide film (tunnel insulating film) 102 of thickness about 8 nm is formed by the thermal oxidation method within a temperature range from 800° C. to 1,000° C. Subsequently, a polycrystalline silicon layer (charge storage layer) 103 having a thickness of about 6 nm and doped with phosphorous (P) is formed on the silicon oxide film 102 by the LPCVD method using silane ($SiH_4$) and phosphine ($PH_3$) as material gas. The charge storage layer 103 is an amorphous silicon layer when formed at low temperature.

Subsequently, a silicon oxide film 202 of thickness about 1 nm is formed on the polycrystalline silicon layer 103 by the ALD method using BTBAS [bis (tertiary butyl amino) silane : $SiH_2$ (t-$BuNH_2$)] and ozone ($O_3$), or 3DMAS (SiH ($N(CH_3)_2)_3$) and ozone ($O_3$) as a material gas.

Subsequently, a lanthanum aluminum oxide film 203 of thickness about 2 nm is formed by the sputtering method within a temperature range from the room temperature to 700° C. Then, the resultant structure is subjected to a heating process in the rapid heating furnace at 900 to 1,050° C. As a result, as shown in FIG. 17, the silicon oxide film 202 and the lanthanum aluminum oxide film 203 mix together to form a lanthanum aluminum silicon oxide film 105 as a first dielectric film 105 included in an inter-gate insulating film 104. At this time, the lanthanum aluminum silicon oxide film 105 remains amorphous.

Subsequently, as shown in FIG. 18, a lanthanum hafnium aluminum oxide film 106 and a lanthanum aluminum silicon oxide film 201 are deposited in order by the sputtering method within a temperature range from the room temperature to 700° C. as a hafnium aluminum oxide film 106 included in the block insulating film 104. The resultant structure is then subjected to a heating process in the rapid heating furnace at 900 to 1,050° C. again. As a result, the crystallized lanthanum hafnium oxide film 106 and the amorphous lanthanum aluminum silicon oxide film 201 as a third dielectric film 201 included in the inter-gate insulating film 104 are formed.

Subsequently, a polycrystalline silicon layer 107 (control gate electrode) doped with phosphorus (P) is formed on the inter-gate insulating film 104 by the LPCVD method as is the case with the charge storage layer 103. Then, a mask material 131 for processing of isolation regions is formed on the polycrystalline silicon layer 107. Subsequently, a photo resist (not shown in the drawings) is formed on the mask material 131 and then exposed and developed. Then, as shown in FIG. 19, the pattern of the photo resist is transferred to the mask material 131 by the RIE method. Thereafter, the photo resist is removed.

Subsequently, as shown in FIG. 20, the polycrystalline silicon layer 107, the inter-gate insulating film 104, the polycrystalline silicon layer 103, and the silicon oxide film 102 are sequentially etched by the RIE method through the mask material 131 as a mask to form slits 122 that separate memory cells arranged adjacent to one another in the row direction. The subsequent manufacturing steps are the same as those in the first embodiment.

The lanthanum aluminum oxide film, the lanthanum hafnium oxide film, and the lanthanum aluminum silicon oxide film may be formed by, instead of the sputtering method, any of the PLD method, the MBE method, the CVD method, the MOCVD method, and the ALD method.

(3. Effects)

The second embodiment uses, as the second insulating film (inter-gate insulating film) 104, the stacked film of the lanthanum aluminum silicon oxide film (first dielectric film) 105, the lanthanum hafnium oxide film (second dielectric film) 106, and the lanthanum aluminum silicon oxide film (third dielectric film) 201. Thus, the second embodiment exerts not only the effects illustrated in the first embodiment but also the following effects.

Even with the treatment at a high temperature of 900 to 1,100° C., the lanthanum aluminum silicon oxide film 201 is unlikely to mix with a layer containing silicon (silicon, silicon oxide, silicon nitride, or silicon oxynitride). This serves to prevent a low-dielectric constant reaction layer containing silicon and oxygen as main components from being formed at the interface between the layer containing silicon (for example, the control gate electrode 107) and the lanthanum aluminum silicon oxide film 201. Thus, a direct junction can be maintained between the lanthanum aluminum silicon oxide film 201 and the control gate electrode 107. For a similar reason, a direct junction can be maintained between the lanthanum aluminum silicon oxide film 105 and the charge storage layer (polycrystalline silicon layer) 103. Thus, a possible increase in EOT of the inter-gate insulating film 104 can be avoided.

Furthermore, even if the lanthanum aluminum silicon oxide film 201 and the polycrystalline silicon layer (control gate electrode) 107 are stacked, the interface between the lanthanum aluminum silicon oxide film 201 and the polycrystalline silicon layer 107 can be prevented from being defective. Thus, the electrical characteristics of the inter-gate insulating film 104 or the control gate electrode 107 can be prevented from being degraded.

Additionally, if the lanthanum aluminum silicon oxide film 201 is located on the side of the control gate electrode 107, the potential barrier between the lanthanum aluminum silicon oxide film 201 and the control gate electrode 107 becomes high. Thus, a tunnel current that may flow from the control gate electrode 107 during erasure, what is called a back tunneling current, can be suppressed. The back tunneling current can further be suppressed using a metal with a large work function.

Moreover, the lanthanum hafnium oxide film 106 has a dielectric constant of about 25, thus enabling an increase in EOT of the inter-gate insulating film to be reduced. Hence, memory cells driven by a low voltage can be provided.

[Third Embodiment]

The stacked gate structure in the third embodiment is the same as that in the first embodiment and is formed by a manufacturing method different from that in the first embodiment.

The cross-sectional view showing the configuration of the nonvolatile semiconductor memory device according to the third embodiment is the same as FIG. 1. As shown in FIG. 1, a silicon oxide film 102 of thickness about 5 nm is provided on the channel region between source/drain regions 111 as a first insulating film (tunnel insulating film) 102. A silicon nitride film 103 of thickness about 6 nm is provided on the tunnel insulating film 102 as a charge storage layer 103.

A stacked film of a lanthanum aluminum silicon oxynitride film (first dielectric film) 105 of thickness about 6 nm and a hafnium aluminum oxide film (second dielectric film) 106 of thickness about 5 nm is provided on the charge storage layer 103 as a second insulating film (block insulating film) 104. The lanthanum aluminum silicon oxide film 105 is amorphous. The hafnium aluminum oxide film 106 is crystallized (the hafnium aluminum oxide film 106 has a single-crystal or polycrystalline structure). A titanium aluminum nitride film 107 is provided on the block insulating film 104 as a control gate electrode 107. A tungsten film 108 is provided on the control gate electrode 107 as a low-resistance metal film.

Now, a method for manufacturing a nonvolatile semiconductor memory device according to the third embodiment will be described. FIGS. 21 to 26, used to describe the manufacturing method, are cross-sectional views taken along the channel width direction (row direction).

Figure 21:
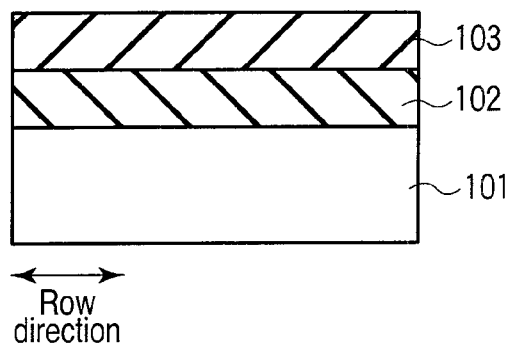
FIG. 21 is a cross-sectional view illustrating a step of manufacturing a nonvolatile semiconductor memory device according to a third embodiment.

First, as shown in FIG. 21, after the surface of the p-type silicon substrate 101 is cleaned, a silicon oxide film (tunnel insulating film) 102 of thickness about 5 nm is formed by the thermal oxidation method within a temperature range from 800° C. to 1,000° C. Subsequently, a silicon nitride film (charge storage layer) 103 having a thickness of about 8 nm is formed on the silicon oxide film 102 by the LPCVD method using dichlorosilane ($SiH_2Cl_2$) and ammonia ($NH_3$) as a material gas within a temperature range from 600° C. to 800° C. The charge storage layer 103 may be an n-type polycrystalline silicon doped with an n-type dopant [phosphorous (P) or arsenic (As)] or p-type polycrystalline silicon doped with a p-type dopant [boron (B)].

Figure 22:
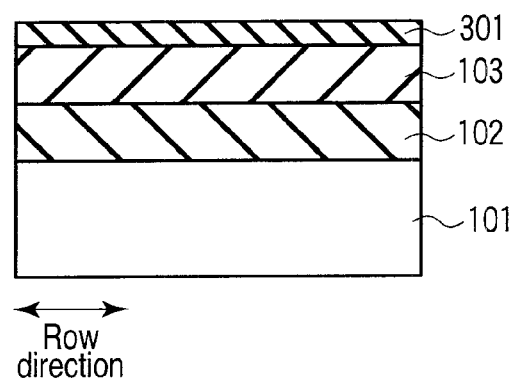
FIG. 22 is a cross-sectional view illustrating a manufacturing step continued from FIG. 21.
Figure 23:
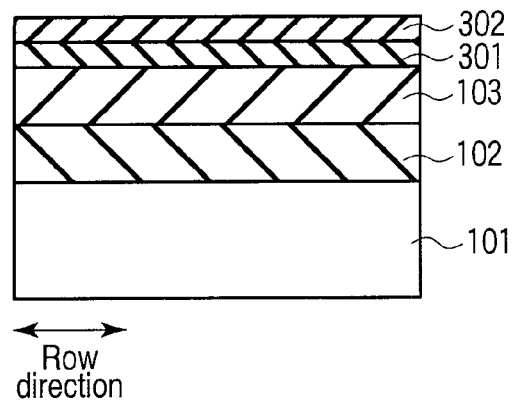
FIG. 23 is a cross-sectional view illustrating a manufacturing step continued from FIG. 22.

Subsequently, as shown in FIG. 22, a surface portion of the silicon nitride film 103 is oxidized in an oxidation heating furnace to form a silicon nitride film 103 of thickness about 6 nm and a silicon oxynitride film 301 of thickness about 2 nm. Then, as shown in FIG. 23, a lanthanum aluminum oxynitride film 302 of thickness about 4 nm is formed on the silicon oxynitride film 301 by the sputtering method within a temperature range from the room temperature to 700° C. Then, the resultant structure is subjected to a heating process in the rapid heating furnace at 900 to 1,050° C. As a result, as shown in FIG. 24, the silicon oxynitride film 301 and the lanthanum aluminum oxynitride film 302 mix together to form a lanthanum aluminum silicon oxynitride film 105 of thickness about 6 nm as a first dielectric film 105 included in an inter-gate insulating film 104. At this time, the lanthanum aluminum silicon oxynitride film 105 remains amorphous.

Subsequently, as shown in FIG. 25, a hafnium aluminum oxide film 106 of thickness about 5 nm and a titanium aluminum nitride film (control gate electrode) 107 are deposited in order by the sputtering method within a temperature range from the room temperature to 700° C. as a second dielectric film 106 included in the block insulating film 104. Then, a mask material 131 for processing of isolation regions is deposited on the tantalum nitride film 107.

Subsequently, a photo resist (not shown in the drawings) is formed on the mask material 131 and then exposed and developed. As shown in FIG. 26, the pattern of the photo resist is transferred to the mask material 131 by an RIE method. The subsequent manufacturing steps are the same as those in the first embodiment.

The above-described manufacturing method is only illustrative. The memory cells may be formed by any other manufacturing method. The lanthanum aluminum oxynitride film 302, the hafnium aluminum oxide film 106, and the titanium aluminum nitride film 107 may be formed by, instead of the sputtering method, any of the PLD method, the MBE method, the CVD method, the MOCVD method, and the ALD method.

As described above in detail, even if the nonvolatile semiconductor memory device is formed using the manufacturing method according to the third embodiment, effects similar to those of the first embodiment may be exerted.

[Fourth Embodiment]

The stacked gate structure in a fourth embodiment is the same as that in the first embodiment and is formed by a manufacturing method different from that in the first embodiment.

The cross-sectional view showing the configuration of the nonvolatile semiconductor memory device according to the fourth embodiment is the same as FIG. 15. As shown in FIG. 15, a silicon oxide film 102 of thickness about 8 nm is provided on the channel region between source/drain regions 111 as a first insulating film (tunnel insulating film) 102. A polycrystalline silicon layer 103 having a thickness of about 6 nm and doped with phosphorous (P) is provided on the tunnel insulating film 102 as a charge storage layer (floating gate electrode) 103.

A stacked film is provided on the charge storage layer 103 as a second insulating film (inter-gate insulating film) 104; the stacked film comprises a lanthanum aluminum silicon oxide film 105 of thickness about 3 nm, a hafnium silicon oxynitride film 106 of thickness about 6 nm, and a lanthanum aluminum silicon oxide film 201 of thickness about 3 nm. The lanthanum aluminum silicon oxide films 105 and 210 are amorphous. The hafnium silicon oxynitride film 106 is crystallized (the hafnium oxynitride film 106 has a single-crystal or polycrystalline structure). A polycrystalline silicon layer 107 doped with phosphorous (P) is provided on the block insulating film 104 as a control gate electrode 107. A tungsten film 108 is provided on the control gate electrode 107 as a low--resistance metal film.

Now, a method for manufacturing a nonvolatile semiconductor memory device according to the fourth embodiment will be described. FIGS. 27 to 31, used to describe the manufacturing method, are cross-sectional views taken along the channel width direction (row direction).

First, as shown in FIG. 27, after the surface of the p-type silicon substrate 101 is cleaned, a silicon oxide film (tunnel insulating film) 102 of thickness about 8 nm is formed by the thermal oxidation method within a temperature range from 800° C. to 1,000° C. Subsequently, a polycrystalline silicon layer 103 (charge storage layer) having a thickness of about 6 nm and doped with phosphorous (P) is formed on the silicon oxide film 102 by the LPCVD method using silane (SiH$_4$) and phosphine (PH$_3$) as a material gas within a temperature range from 550° C. to 700° C. The charge storage layer 103 is an amorphous silicon layer when formed at low temperature.

Subsequently, a lanthanum aluminum oxide film 401 of thickness about 2 nm is formed by the sputtering method within a temperature range from the room temperature to 700° C. Then, the resultant structure is introduced into a heating oxidation furnace and heated in an oxygen atmosphere at 200 to 700° C. for several seconds to several minutes. As a result, as shown in FIG. 28, an interface reaction layer 402 mainly comprising silicon and oxygen is formed at the interface between the polycrystalline silicon layer 103 and the lanthanum aluminum oxide film 401.

Subsequently, the sample is subjected to a heating process in the rapid heating furnace at 900 to 1,050° C. As a result, as shown in FIG. 29, the interface reaction layer 402 and the lanthanum aluminum oxide film 401 mix together to form a lanthanum aluminum silicon oxide film 105 as a first dielectric film included in the inter-gate insulating film 104. At this time, the lanthanum aluminum silicon oxide film 105 remains amorphous. Instead of the lanthanum aluminum oxide 401, lanthanum aluminum oxynitride may be used. In this case, the interface reaction layer 402 comprises a layer mainly containing silicon and oxygen, or a layer mainly containing silicon, oxygen, and nitrogen. The interface reaction layer 402 and the lanthanum aluminum oxynitride 401 are mixed together to form the lanthanum aluminum silicon oxynitride film 105 as the first dielectric film 105.

Subsequently, as shown in FIG. 30, a hafnium silicon oxynitride film 106 and a lanthanum aluminum silicon oxide film 201 are deposited on the lanthanum aluminum silicon oxide film 105 in order by the sputtering method within a temperature range from the room temperature to 700° C. The resulting structure is then subjected to a heating process in the rapid heating furnace at 900 to 1,050° C. again. As a result, a crystallized hafnium silicon oxynitride film 106 is formed as a second dielectric film 106 included in the inter-gate insulating film 104, and an amorphous lanthanum aluminum silicon oxide film 201 is formed as a third dielectric film 201 included in the inter-gate insulating film 104.

Subsequently, a polycrystalline silicon layer 107 (control gate electrode) doped with phosphorous (P) is formed on the inter-gate insulating film 104 by the LPCVD method as is the case with the charge storage layer 103. Then, a mask material 131 for processing of isolation regions is deposited on the polycrystalline silicon layer 107. Subsequently, a photo resist (not shown in the drawings) is formed on the mask material 131 and then exposed and developed. As shown in FIG. 31, the pattern of the photo resist is transferred to the mask material 131 by the RIE method. The subsequent manufacturing steps are the same as those in the first embodiment.

The above-described manufacturing method is only illustrative. The memory cells may be formed by any other manufacturing method. For example, in the above-described manufacturing method, silicon oxynitride may be used as the charge storage layer 103. Here, if a lanthanum aluminum oxide film 401 is formed on the charge storage layer 103, a lanthanum aluminum silicon oxynitride film is formed and stabilized at the interface between the charge storage layer 103 and the lanthanum aluminum oxide film 401. Alternatively, if instead of the lanthanum aluminum oxide 401, lanthanum aluminum oxynitride is formed on the charge storage layer 103, a lanthanum aluminum silicon oxynitride film is formed and stabilized at the interface between the charge storage layer 103 and the lanthanum aluminum oxide film 401.

Furthermore, in the above-described manufacturing method, the lanthanum aluminum oxide film 401, the hafnium silicon oxynitride film 106, and the lanthanum aluminum silicon oxide film 201 may be formed by, instead of the sputtering method, any of the PLD method, the MBE method, the CVD method, the MOCVD method, and the ALD method.

As described above in detail, even if the nonvolatile semiconductor memory device is formed using the manufacturing method according to the fourth embodiment, effects similar to those of the second embodiment may be exerted.

Moreover, the hafnium silicon oxynitride used as the second dielectric film 106 included in the inter-gate insulating film 104 has a high dielectric constant of about 16 (the dielectric constant depends on the concentration of hafnium). This enables a reduction in EOT of the inter-gate insulating film 104, thus providing a memory cell driven by a low voltage.

APPLIED EXAMPLE

The present embodiments are applicable to nonvolatile semiconductor memories comprising memory cells each with a charge storage layer comprising an insulator or a conductor, particularly flash memories with a NAND element configuration.

The charge storage layers described in the present embodiments need not necessarily be an insulating film with a finite thickness. For example, the present embodiments are also applicable to an "interface trap memory" that uses a charge trap center present between the tunnel insulating layer and the block insulating film, instead of the charge storage layer. The present embodiments are also applicable to a block insulating film with nanodot memory cells.

Additionally, the present embodiments are characterized by the configuration of the second insulating film. Thus, the stacked gate structures according to the present embodiments may be used regardless of the distribution of the dopant on the substrate side. Hence, the present embodiments are effective on D-type NAND flash memories in which each memory cell has no source/drain diffusion layer.

Based on the above-described concept, the stacked gate structures according to the present embodiments need not necessarily be formed on a silicon substrate. For example, each of the stacked gate structures according to the present embodiments may be formed in a well region formed in the silicon substrate. Furthermore, instead of the silicon substrate, an SiGe substrate, a Ge substrate, an SiGeC substrate, or the like may be used, and each of the stacked gate structures according to the present embodiments may be formed in a well region formed in any of these substrates. Moreover, an SOI (silicon on insulator) substrate, an SGOI (silicon-germanium on insulator) substrate, a GOI (germanium on insulator) substrate, and the like may be used in which a thin film semiconductor is formed on an insulating film, and each of the stacked gate structures according to the present embodiments may be formed in a well region formed in any of these substrates.

Furthermore, in the above-described present embodiments, the memory cell comprises an n-channel MOS (metal oxide semiconductor) transistor formed on a p-channel silicon substrate (including a well region). However, this may be replaced with a p-channel MOS transistor formed on an n-channel silicon substrate (including a well region). In this case, the source region and the drain region have a p conductivity type.

Additionally, the present embodiments correspond to embodiments relating to a technique for elements in the memory cell and do not depend on the manner of connections at the circuit level of the memory cells. Thus, the present embodiments are widely applicable to, besides the NAND nonvolatile semiconductor memories, nonvolatile semiconductor memories of a NOR type, an AND type, and a DINOR (Divided bit-line NOR) type, 2-transistor (Tr) flash memories into which the advantages of the NOR and NAND types are merged, and 3Tr flash memories configured such that one memory cell is sandwiched between two select transistors.

Moreover, the second insulating film according to the present embodiments is characterized by reducing leakage current in both the high electric field region and the low electric field region. Thus, the object to which the present embodiments are applied is not limited to nonvolatile semiconductor memories. The second insulating film according to the present embodiments may be used as, for example, an insulating film in a DRAM (dynamic random access memory) or a gate insulating film in a CMOS (complementary metal oxide semiconductor).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a source region and a drain region provided on a surface area of a semiconductor region;
    a tunnel insulating film provided on a channel between the source region and the drain region;
    a charge storage layer provided on the tunnel insulating film;
    a first dielectric film provided on the charge storage layer and containing lanthanum aluminum silicon oxide or oxynitride;
    a second dielectric film provided on the first dielectric film and containing oxide or oxynitride containing at least one of hafnium (Hf), zirconium (Zr), titanium (Ti), and a rare earth metal;
    a control gate electrode provided on the second dielectric film, and
    wherein the second dielectric film is single crystal or polycrystalline.

2. The device of claim 1, further comprising a third dielectric film provided between the second dielectric film and the control gate electrode and containing lanthanum aluminum silicon oxide or oxynitride.

3. The device of claim 1, wherein the lanthanum aluminum silicon oxide or oxynitride is amorphous.

4. The device of claim 1, wherein the second dielectric film further contains at least one of silicon (Si) and aluminum (Al).

5. The device of claim 1, wherein the control gate electrode contains polycrystalline silicon doped with a p-type dopant or an n-type dopant, transition metal silicide, or nitride containing at least one of aluminum (Al), titanium (Ti), and tantalum (Ta).

6. The device of claim 1, wherein the charge storage layer contains polycrystalline silicon doped with a p-type dopant or an n-type dopant, silicon nitride, or oxide or oxynitride containing at least one of aluminum (Al), hafnium (Hf), zirconium (Zr), and titanium (Ti).

7. The device of claim 1, wherein a composition ratio of lanthanum (La), aluminum (Al), and silicon (Si) contained in the lanthanum aluminum silicon oxide or oxynitride satisfies a condition that $1 \leqq (La+Al)/Si \leqq 4$.

8. The device of claim 1, wherein a composition ratio of lanthanum (La), aluminum (Al), and silicon (Si) contained in the lanthanum aluminum silicon oxide or oxynitride satisfies a condition that $La/(Al+Si) \leqq 1$.

9. The device of claim 1, wherein a composition ratio of lanthanum (La) and aluminum (Al) contained in the lanthanum aluminum silicon oxide or oxynitride satisfies a condition that $0.5 \leqq La/Al \leqq 2$.

10. The device of claim 1, wherein a composition ratio of lanthanum (La) and aluminum (Al) contained in the lanthanum aluminum silicon oxide or oxynitride satisfies a condition that $1 \leqq La/Al \leqq 2$.

* * * * *